US012770836B2

(12) United States Patent
Lee et al.

(10) Patent No.: US 12,770,836 B2
(45) Date of Patent: Oct. 20, 2026

(54) APPARATUS FOR TREATING SUBSTRATE

(71) Applicant: SEMES CO., LTD., Chungcheongnam-do (KR)

(72) Inventors: Hanglim Lee, Cheonan-si (KR); Minyoung Kim, Hwaseong-si (KR); Jihoon Park, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 1332 days.

(21) Appl. No.: 17/335,239

(22) Filed: Jun. 1, 2021

(65) Prior Publication Data

US 2021/0375596 A1 Dec. 2, 2021

(30) Foreign Application Priority Data

Jun. 2, 2020 (KR) ........................ 10-2020-0066375

(51) Int. Cl.
*H01J 37/32* (2006.01)
*H10P 72/00* (2026.01)

(52) U.S. Cl.
CPC .. *H01J 37/32568* (2013.01); *H01J 37/32715* (2013.01); *H01J 37/32825* (2013.01); *H01J 2237/2007* (2013.01); *H01J 2237/20214* (2013.01); *H01J 2237/336* (2013.01); *H10P 72/0468* (2026.01)

(58) Field of Classification Search
None
See application file for complete search history.

(56) References Cited

U.S. PATENT DOCUMENTS 7,323,080 B2 * 1/2008 Kim .................. H01L 21/67051 156/345.39
7,963,248 B2 * 6/2011 Kim ..................... H05H 1/2406 156/345.43

(Continued)

FOREIGN PATENT DOCUMENTS

CN 101131547 A 2/2008
JP 2007-273947 A 10/2007

(Continued)

OTHER PUBLICATIONS

KR-2009019435-A, Kim et al., Substrate Processing Method, Feb. 25, 2009, abstract. (Year: 2009).*

(Continued)

*Primary Examiner* — Sylvia Macarthur
*Assistant Examiner* — Michelle Crowell
(74) *Attorney, Agent, or Firm* — Li & Cai Intellectual Property (USA) Office

(57) ABSTRACT

Disclosed is a substrate treating apparatus that includes an index module including a plurality of load ports on each of which a carrier having a substrate received therein is placed and a transfer frame in which an index robot that transfers the substrate is installed, a process module that is connected with the index module and that includes process chambers in each of which the substrate is treated, and a substrate treating unit that is provided in the index module and that treats the substrate, the substrate treating unit being provided along a direction in which the plurality of load ports are arranged.

7 Claims, 14 Drawing Sheets

(56) References Cited

U.S. PATENT DOCUMENTS

| | | | | |
|---|---|---|---|---|
| 8,398,812 | B2 * | 3/2013 | Kim | H01L 21/6708 134/1.1 |
| 9,111,729 | B2 * | 8/2015 | Gottscho | H01J 37/32366 |
| 11,897,005 | B2 * | 2/2024 | Kim | H05H 1/2443 |
| 2009/0186167 | A1 * | 7/2009 | Tsuji | H05H 1/30 427/569 |
| 2010/0055915 | A1 * | 3/2010 | Kanegae | B08B 7/0035 156/345.21 |
| 2019/0035636 | A1 * | 1/2019 | Yoshimizu | H01J 37/32 |
| 2020/0126948 | A1 * | 4/2020 | Lee | H01L 21/6715 |
| 2021/0086238 | A1 * | 3/2021 | Horikoshi | H01L 21/6708 |
| 2021/0302841 | A1 * | 9/2021 | Horikoshi | H01L 21/6708 |
| 2021/0358720 | A1 * | 11/2021 | Lee | H01J 37/32449 |
| 2024/0006166 | A1 * | 1/2024 | Kim | H01J 37/32449 |

FOREIGN PATENT DOCUMENTS

| | | | |
|---|---|---|---|
| KR | 1020050050412 | A | 5/2005 |
| KR | 1020080027457 | A | 3/2008 |
| KR | 10-2009-0046556 | A | 5/2009 |
| KR | 10-2011-0131157 | A | 12/2011 |
| KR | 1020110134105 | A | 12/2011 |
| KR | 10-2013-0085637 | A | 7/2013 |
| KR | 10-2014-0048385 | A | 4/2014 |
| KR | 1020180046272 | A | 5/2018 |
| KR | 101869617 | B1 | 6/2018 |
| KR | 1020210043181 | A | 4/2021 |

OTHER PUBLICATIONS

Korean Patent Office, Office action issued on Nov. 16, 2022.

China Patent and Trademark Office, Office Action issued on Nov. 18, 2025 for CN application No. 202110609914.8.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2020-0066375 filed on Jun. 2, 2020, in the Korean Intellectual Property Office, the entire contents of which are hereby incorporated by reference.

BACKGROUND

Embodiments of the inventive concept described herein relate to a substrate treating apparatus and method, and more particularly, relate to an apparatus and method for treating a substrate using plasma.

Industrially used plasma may be divided into low-temperature plasma and thermal plasma. The low-temperature plasma is most widely used in a semiconductor manufacturing process, and the thermal plasma is applied to metal cutting.

Atmospheric plasma refers to a technology for generating low-temperature plasma while maintaining the pressure of a gas in a range of 100 Torr to atmospheric pressure (760 Torr). An atmospheric plasma system is economical because it does not require expensive vacuum equipment. Furthermore, the atmospheric plasma system is able to perform a process in an in-line form without pumping. Accordingly, a plasma system capable of maximizing productivity is able to be developed. Atmospheric plasma systems are used in various application fields such as high-speed etching & coating technology, semiconductor packaging, display, surface modification and coating of materials, generation of nano particles, removal of harmful gases, generation of oxidizing gases, and the like.

A linear type plasma generation apparatus for generating atmospheric plasma may apply only a predetermined flow rate and a predetermined mixing ratio through one gas supply line and may perform plasma treatment while moving an object in a direction perpendicular to the lengthwise direction of the plasma generation apparatus.

Accordingly, a space at least two times greater than the area of the object is required to move the object, and therefore a wide essential space may be required when a plasma treatment apparatus is configured. Furthermore, when a circular object (e.g., a wafer) rather than a quadrilateral object is treated, an unnecessary portion (an outer portion of the circular object that deviates from the length of the plasma generation apparatus) has to be treated, and therefore a lower transfer apparatus may be corroded.

SUMMARY

Embodiments of the inventive concept provide a substrate treating apparatus and method for performing uniform plasma treatment on a circular object to be treated.

Furthermore, embodiments of the inventive concept provide a substrate treating apparatus and method for making an atmospheric plasma treatment apparatus compact and reducing process time required for plasma treatment on a large-area object to be treated.

Moreover, embodiments of the inventive concept provide a substrate treating apparatus and method having a substrate treating unit provided in an index module together with load ports.

In addition, embodiments of the inventive concept provide a substrate treating apparatus for independently treating a substrate outside equipment by providing, outside the equipment, an apparatus for hydrophilizing or hydrophobicizing a substrate surface using atmospheric plasma.

The technical problems to be solved by the inventive concept are not limited to the aforementioned problems, and any other technical problems not mentioned herein will be clearly understood from the following description by those skilled in the art to which the inventive concept pertains.

According to an embodiment, a substrate treating unit includes a spin chuck having a substrate placed thereon, a lower electrode provided in the spin chuck, and a plasma generation apparatus that is located over the spin chuck and that generates plasma. The plasma generation apparatus includes a first upper electrode unit that performs plasma treatment on an entire surface of the substrate and a second upper electrode unit that performs plasma treatment on a local area of the substrate.

The first upper electrode unit may include a first reactor body that is provided in a linear type along a lengthwise direction across the substrate and that performs plasma treatment on a surface of the substrate that rotates together with the spin chuck.

The first upper electrode unit may include a first reactor body having a hollow bar shape provided in a linear type along a lengthwise direction across the substrate, the first reactor body having a discharge space inside, and a nozzle that is provided in a linear type on a bottom surface of the first reactor body along the lengthwise direction and that ejects plasma generated in the discharge space to the substrate placed on the spin chuck.

The substrate treating unit may further include a first actuator that moves the first reactor body such that the first reactor body horizontally moves over the spin chuck along a first direction, and the nozzle may have a length greater than or equal to a diameter of the substrate.

The second upper electrode unit may include a second reactor body that locally performs plasma treatment on a surface of the substrate while moving over the substrate.

The second reactor body may be movable on the first reactor body along a second direction perpendicular to the first direction.

The second reactor body may be moved along a drive rail installed on a side surface of the first reactor body.

The second reactor body may be provided on a separate moving arm and may locally perform plasma treatment on the surface of the substrate while moving together with the moving arm.

The first reactor body may include independent discharge spaces separated by a plurality of partition walls, and a reactant gas may be independently supplied into the independent discharge spaces.

The substrate treating unit may be attached to and detached from an index module.

The substrate treating unit may be an atmospheric plasma treatment apparatus.

According to an embodiment, substrate treating equipment includes an index module including a plurality of load ports on each of which a carrier having a substrate received therein is placed and a transfer frame in which an index robot that transfers the substrate is installed, a process module that is connected with the index module and that includes process chambers in each of which the substrate is treated, and a substrate treating unit that is provided so as to be attachable to and detachable from the index module and that includes a plasma generation apparatus that performs plasma treatment on the substrate. The plasma generation apparatus includes a first upper electrode unit that performs plasma treatment on an entire surface of the substrate placed on a spin chuck and a second upper electrode unit that performs plasma treatment on a local area of the substrate placed on the spin chuck.

The first upper electrode unit may include a first reactor body having a hollow bar shape provided in a linear type along a lengthwise direction across the substrate, the first reactor body having a discharge space inside, and a nozzle that is provided in a linear type on a bottom surface of the first reactor body along the lengthwise direction and that ejects plasma generated in the discharge space to the substrate placed on the spin chuck.

The substrate treating equipment may further include an actuator that moves the first reactor body such that the first reactor body horizontally moves over the spin chuck, and the nozzle may have a length greater than or equal to a diameter of the substrate.

The second upper electrode unit may include a second reactor body that locally performs plasma treatment on a surface of the substrate while moving over the substrate, and the second reactor body may be movable on the first reactor body.

The second upper electrode unit may include a second reactor body that locally performs plasma treatment on a surface of the substrate while moving over the substrate, and the second reactor body may be provided on a separate moving arm and may locally perform plasma treatment on the surface of the substrate while moving together with the moving arm.

The load ports, the transfer frame, and the process module may be arranged in a first direction, and the load ports and the substrate treating unit may be arranged in a second direction perpendicular to the first direction when viewed from above.

The substrate treating unit may hydrophilize or hydrophobicize a surface of the substrate by performing plasma treatment on the substrate at atmospheric pressure.

According to an embodiment, a method for treating a substrate includes a step of locating the first upper electrode unit and the second upper electrode unit over the substrate in a state in which the substrate is placed on the spin chuck and a step of performing plasma treatment on a surface of the substrate using at least one of the first upper electrode unit or the second upper electrode unit when the spin chuck rotates.

The step of performing the plasma treatment may include an entire surface treatment step of performing plasma treatment on an entire surface of the substrate by using the first upper electrode unit and a local treatment step of selectively performing plasma treatment on an area where plasma treatment is insufficient, by using the second upper electrode unit after the entire surface treatment step.

In the step of performing the plasma treatment, performing plasma treatment on an entire surface of the substrate using the first upper electrode unit and selectively and locally performing plasma treatment on a specific area of the substrate using the second upper electrode unit may be simultaneously performed.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
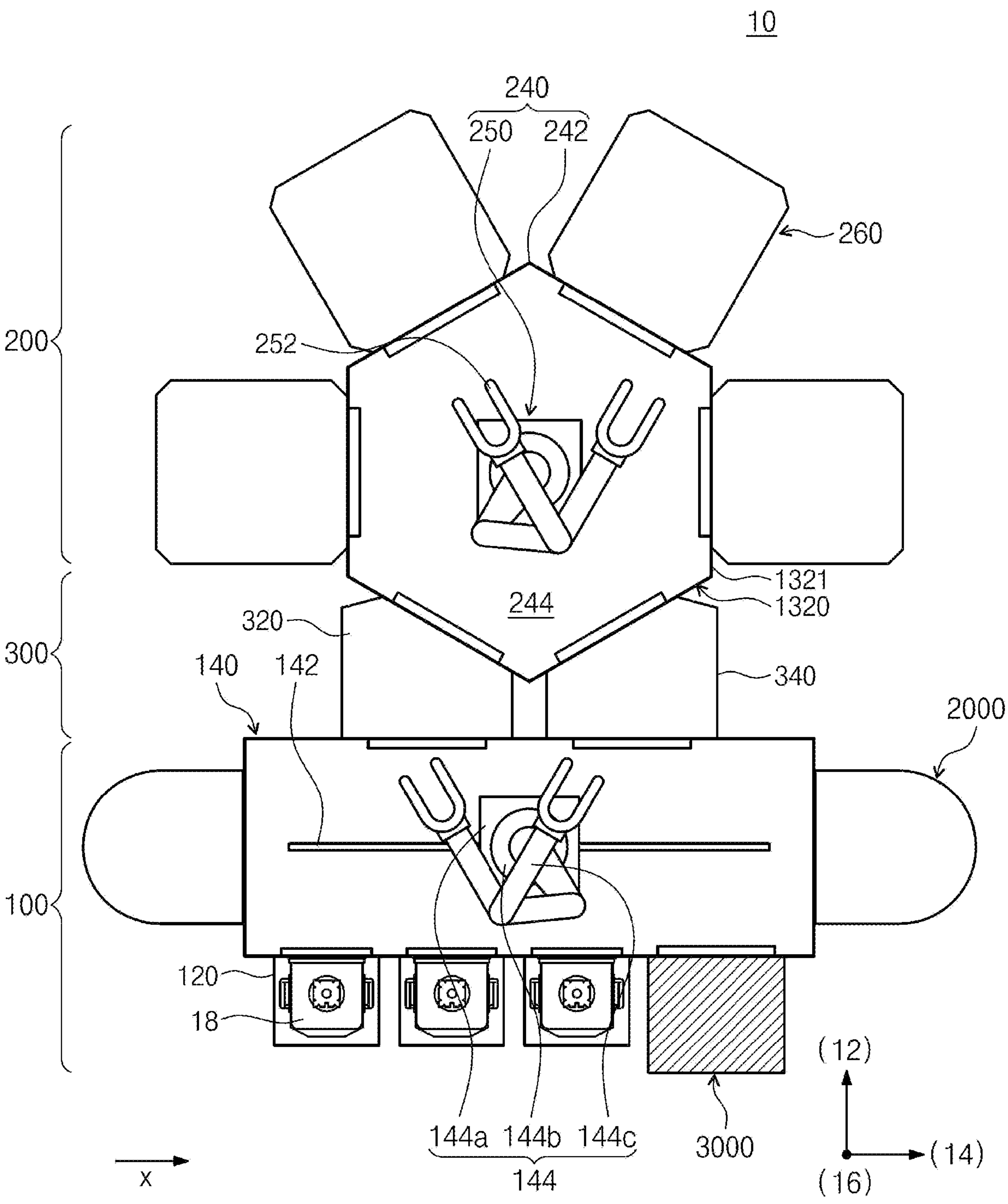
FIG. 1 is a plan view illustrating substrate treating equipment according to an embodiment of the inventive concept.

The above and other aspects, features, and advantages of the inventive concept will become apparent from the following description of embodiments given in conjunction with the accompanying drawings. However, the inventive concept is not limited to the embodiments disclosed herein, and the scope of the inventive concept should be limited only by the accompanying claims and equivalents thereof. Unless otherwise defined, all terms used herein, including technical or scientific terms, have the same meanings as those generally understood by those skilled in the art to which the inventive concept pertains. General descriptions related to well-known configurations will be omitted when they may make subject matters of the inventive concept unnecessarily obscure. Identical reference numerals are used to refer to identical or corresponding components in the drawings of the inventive concept if possible. For a better understanding of the inventive concept, the shapes and dimensions of components may be exaggerated or reduced in the drawings.

The terminology used herein is for the purpose of describing particular embodiments only and is not intended to limit the scope of the inventive concept. The terms of a singular form may include plural forms unless otherwise specified. It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, an apparatus for treating a substrate using plasma according to an embodiment of the inventive concept will be described. For example, a substrate treating unit according to an embodiment of the inventive concept may be a substrate treating apparatus for hydrophilizing or hydrophobicizing a surface of a substrate using plasma.

Figure 2:
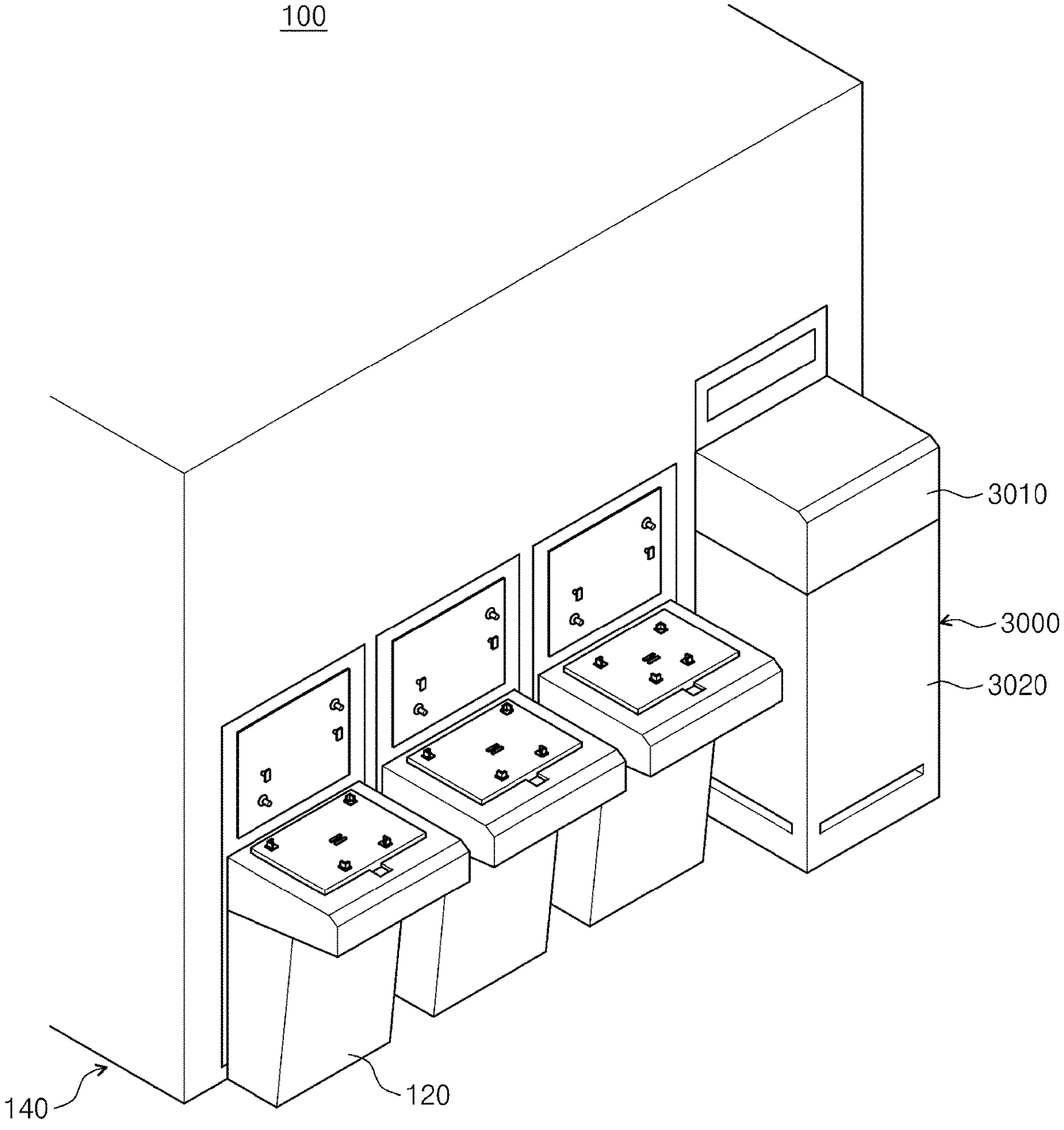
FIG. 2 is a view illustrating a substrate treating unit installed in an index module illustrated in FIG. 1.
Figure 3:
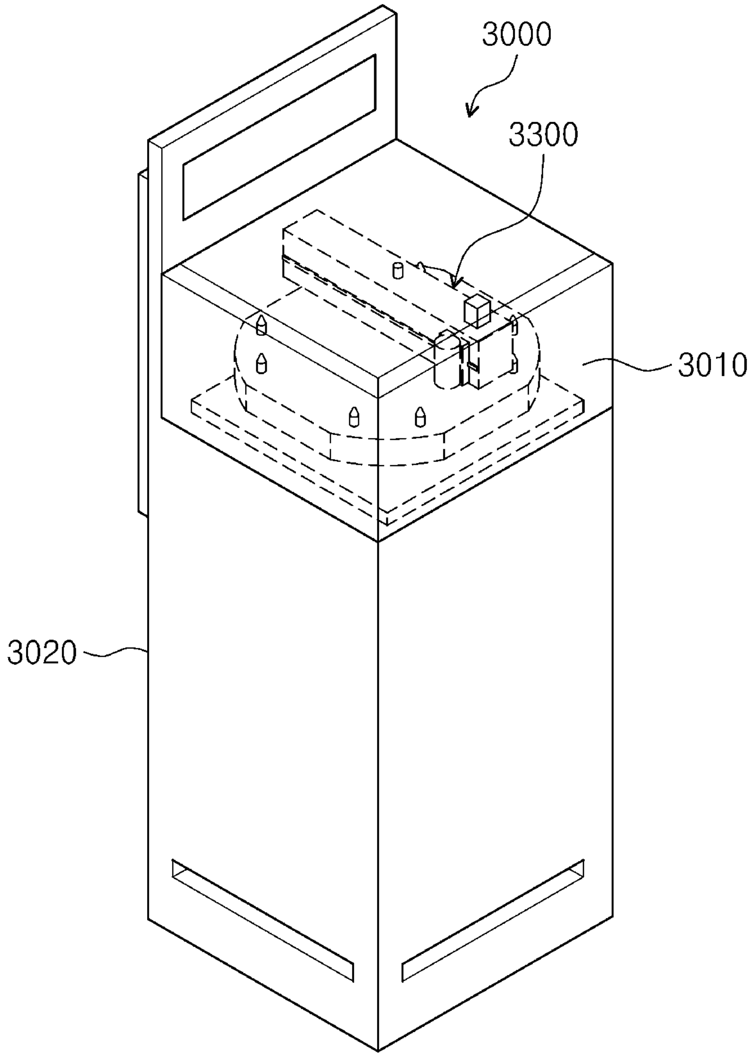
FIGS. 3 to 6 are views illustrating the substrate treating unit according to an embodiment of the inventive concept.
Figure 4:
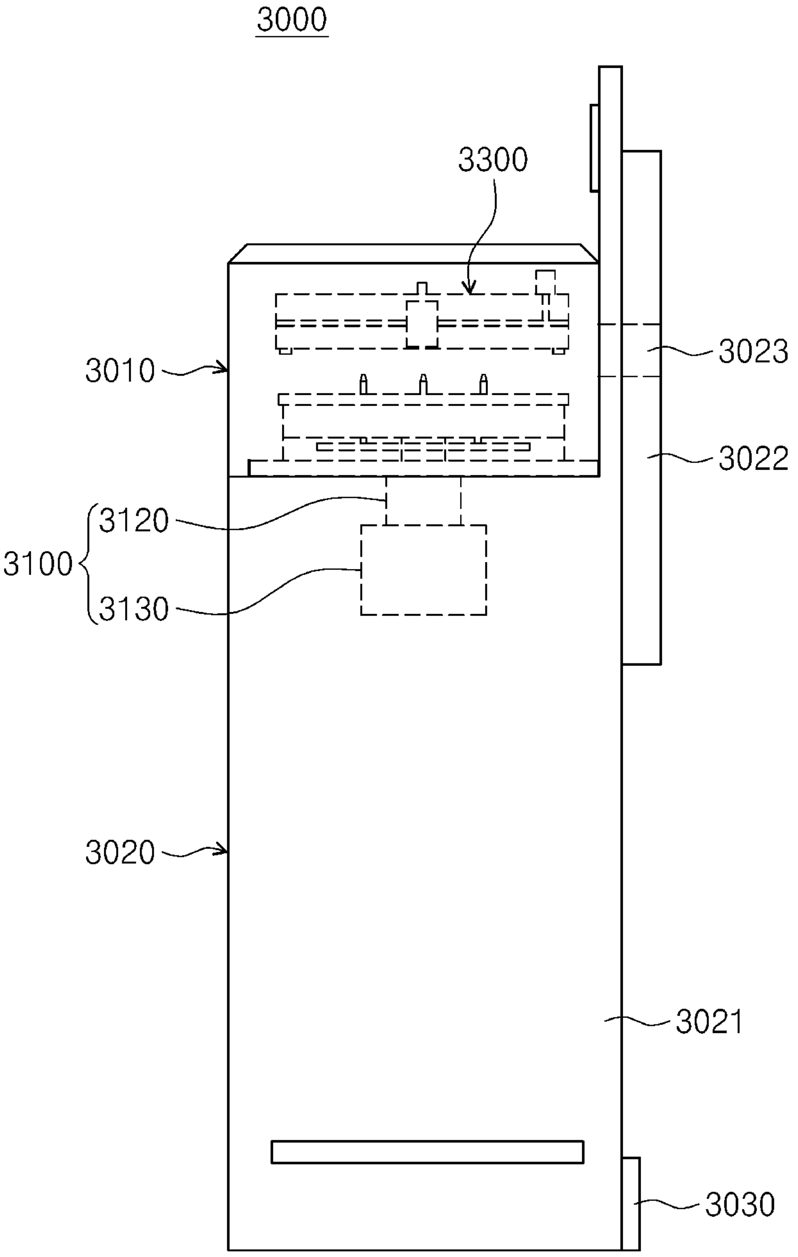

FIG. 1 is a plan view illustrating substrate treating equipment according to an embodiment of the inventive concept, and FIG. 2 is a view illustrating a substrate treating unit installed in an index module illustrated in FIG. 1.

Referring to FIGS. 1 and 2, the substrate treating equipment 10 may include the index module 100, a loading module 300, and a process module 200.

The index module 100 may include load ports 120, a transfer frame 140, and buffer units 2000. The load ports 120, the transfer frame 140, the loading module 300, and the process module 200 may be sequentially arranged in a row. Hereinafter, a direction in which the load ports 120, the transfer frame 140, the loading module 300, and the process module 200 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

Carriers 18, each of which has a plurality of substrates W received therein, are seated on the load ports 120. The load ports 120 are disposed in a row along the second direction 14. Slots (not illustrated) for supporting edges of the substrates W are formed in each of the carriers 18. The slots are stacked one above another with a spacing gap therebetween in the carrier 18 along the third direction 16. A front opening unified pod (FOUP) may be used as the carrier 18. Furthermore, the substrate treating unit 3000 may be provided in the second direction 14 in which the load ports 120 are arranged. The substrate treating unit 3000 may be provided along the direction in which the load ports 120 are arranged and may treat the substrates W. The substrate treating unit 3000 will be described below in detail with reference to FIGS. 3 to 6.

The transfer frame 140 transfers the substrates W between the carriers 18 seated on the load ports 120, the buffer units 2000, and the loading module 300. Furthermore, the transfer frame 140 may transfer the substrates W between the substrate treating unit 3000, the buffer units 2000, and the loading module 300. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 has a base **144*a*, a body 144*b*, and index arms 144*c*. The base 144*a* is movable along the index rail 142. The body 144*b* is coupled to the base 144*a*. The body 144*b* is movable on the base 144*a* along the third direction 16. Furthermore, the body 144*b* is rotatable on the base 144*a*. The index arms 144*c* are coupled to the body 144*b* and are movable forward and backward relative to the body 144*b*. The index arms 144*c* are individually driven. The index arms 144*c* are stacked one above another with a spacing gap therebetween along the third direction 16. Some of the index arms 144*c* may be used to transfer the substrates W from the process module 200 to the carriers 18, and the other index arms 144*c* may be used to transfer the substrates W from the carriers 18 to the process module 200. Accordingly, particles generated from the substrates W to be treated may be prevented from adhering to the treated substrates W in a process in which the index robot 144 transfers the substrates W between the carriers 18 and the process module 200**.

The buffer units 2000 temporarily store the substrates W. The buffer units 2000 perform a process of removing process by-products remaining on the substrates W. The buffer units 2000 perform a post-treatment process on the substrates W treated in the process module 200. The post-treatment process may be a process of purging a purge gas on the substrates W. The buffer units 2000 are located to face each other with the transfer frame 140 therebetween. The buffer units 2000 are arranged in the second direction 14. The buffer units 2000 are located on opposite sides of the transfer frame 140. Selectively, only one buffer unit 2000 may be provided on one side of the transfer frame 140.

The loading module 300 is disposed between the transfer frame 140 and a transfer unit 240. For a substrate W to be transferred to the process module 200, the loading module 300 replaces an atmospheric atmosphere of the index module 100 with a vacuum atmosphere of the process module 200, and for a substrate W to be transferred to the index module 100, the loading module 300 replaces the vacuum atmosphere of the process module 200 with the atmospheric atmosphere of the index module 100. The loading module 300 provides a space in which the substrates W stay before transferred between the transfer unit 240 and the transfer frame 140. The loading module 300 may include a load-lock chamber 320 and an unload-lock chamber 340.

The load-lock chamber 320 provides a space in which a substrate W to be transferred from the index module 100 to the process module 200 temporarily stays. The load-lock chamber 320 maintains an atmospheric atmosphere in a standby state and is closed to the process module 200, but is open to the index module 100. When the substrate W is placed in the load-lock chamber 320, an inner space of the load-lock chamber 320 is sealed from the index module 100 and the process module 200. Thereafter, the atmospheric atmosphere in the load-lock chamber 320 is replaced with a vacuum atmosphere, and the load-lock chamber 320 is open to the process module 200 in the state of being closed to the index module 100.

The unload-lock chamber 340 provides a space in which a substrate W to be transferred from the process module 200 to the index module 100 temporarily stays. The unload-lock chamber 340 maintains a vacuum atmosphere in a standby state and is closed to the index module 100, but is open to the process module 200. When the substrate W is placed in the unload-lock chamber 340, an inner space of the unload-lock chamber 340 is sealed from the index module 100 and the process module 200. Thereafter, the vacuum atmosphere in the unload-lock chamber 340 is replaced with an atmospheric atmosphere, and the unload-lock chamber 340 is open to the index module 100 in the state of being closed to the process module 200.

The process module 200 includes the transfer unit 240 and a plurality of process chambers 260.

The transfer unit 240 transfers the substrates W between the load-lock chamber 320, the unload-lock chamber 340, and the plurality of process chambers 260. The transfer unit 240 includes a transfer chamber 242 and a transfer robot 250. The transfer chamber 242 may have a hexagonal shape. Selectively, the transfer chamber 242 may have a rectangular or pentagonal shape. The load-lock chamber 320, the unload-lock chamber 340, and the plurality of process chambers 260 are located around the transfer chamber 242. A transfer space 244 for transfer of the substrates W is provided in the transfer chamber 242.

The transfer robot 250 transfers the substrates W in the transfer space 244. The transfer robot 250 may be located in the center of the transfer chamber 242. The transfer robot 250 may have a plurality of hands 252 that are movable in horizontal and vertical directions and are movable forward or backward or rotatable on a horizontal plane. The hands 252 may be independently driven, and the substrates W may be seated on the hands 252 in a horizontal state. FIG. 1 illustrates the configuration of general front-end equipment. However, even in the configuration of back-end equipment having no chamber, the substrate treating unit 3000 of the inventive concept may be mounted in an index module 100 (e.g., an EFEM).

According to the embodiment of the inventive concept, the substrate treating unit 3000 may be arranged in the index module 100 together with the load ports 120 and may treat a substrate even before the substrate is transferred to the process module 200. Accordingly, efficiency of a substrate treating process may be improved.

FIGS. 3 to 6 are views illustrating the substrate treating unit according to an embodiment of the inventive concept.

Referring to FIGS. 3 to 6, the substrate treating unit 3000 may include a housing 3010, a substrate support unit 3100, a gas supply unit 3200, a plasma generation apparatus 3300, a power supply unit 3500, a control unit 3600, a drive unit 3900, and a base unit 3020.

The substrate treating unit 3000 is an apparatus for performing a series of plasma surface treatments on a semiconductor device substrate using atmospheric plasma.

The housing 3010 may be provided in the form of a chamber that includes an inner treatment space in an atmospheric pressure state. The substrate support unit 3100 having a substrate W placed thereon is located in the inner treatment space. For example, the housing 3010 may have a hollow rectangular parallelepiped shape.

The base unit 3020 is located under the housing 3010 and supports the housing 3010. The base unit 3030 may include a base part 3021, a vertical frame 3022, and an opening 3023. The base part 3021 supports a lower portion of the housing 3010. A coupling member 3030 for fixedly coupling the base unit 3020 and the transfer frame 140 may be provided on the base part 3021. The base part 3021 may have a recess formed on an upper surface thereof. The vertical frame 3022 may be installed on a side surface of the base part 3021. The vertical frame 3022 supports a lateral portion of the housing 3010. The opening 3023 through which the substrate W enters or exits the housing 3010 may be formed in the vertical frame 3022. Furthermore, a door (not illustrated) for supply and withdrawal of the substrate W may be provided on the vertical frame 3022 and may control the supply or withdrawal of the substrate W through the opening 3023.

The substrate treating unit 3000 of the inventive concept may include the housing 3010 and the base unit 3020 supporting the housing 3010 and may be provided in the index module 100 along the arrangement direction of the plurality of load ports 120 as illustrated in FIG. 2. Accordingly, a process may be performed on the substrate W even in the index module 100, and thus process efficiency may be improved. For example, the substrate treating unit 3000 that performs atmospheric plasma treatment may be disposed in the index module 100 and may perform plasma treatment on the substrate W before the substrate W is transferred to the process module 200.

The substrate support unit 3100 may support the substrate W while a process is performed and may be rotated by an actuator 3130, which will be described below, while the process is performed. For example, the substrate support unit 3100 may be a spin chuck having a spin head 3110 that has a circular upper surface and that is used as a lower electrode. The substrate W may be fixed onto the spin head 3110 by an electrostatic force. Alternatively, the substrate support unit 3100 may support the substrate W in various manners such as mechanical clamping or vacuum suction.

A support shaft 3120 supporting the spin head 3110 is connected to a lower portion of the spin head 3110 and is rotated by the actuator 3130 connected to a lower end of the support shaft 3120. The actuator 3130 may be a motor. As the support shaft 3120 rotates, the spin head 3110 and the substrate W rotate. The spin head 3110 is grounded. That is, the spin head 3110 is used as a lower electrode. The spin head 3110 itself may be a lower electrode. Alternatively, a lower electrode may be embedded in the spin head 3110.

The gas supply unit 3200 supplies a process gas. The process gas may include a single gas, such as nitrogen ($N_2$), air, argon (Ar), $C_xF_x$ gas, or the like, or a gas mixture of the single gas and at least one of hydrogen ($H_2$) or oxygen ($O_2$). The gas supply unit 3200 supplies the process gas to a first upper electrode unit 3310 and a second upper electrode unit 3320 of the plasma generation apparatus 3300 located over the substrate support unit 3100.

The plasma generation apparatus 3300 is installed over the spin head 3110 to correspond to the spin head 3110 and generates and ejects a plasma gas required for surface treatment of the substrate W. The plasma generation apparatus 3300 may include the first upper electrode unit 3310 and the second upper electrode unit 3320.

The first upper electrode unit 3310 is provided to perform plasma treatment on the entire surface of the substrate W, and the second upper electrode unit 3320 is provided to perform plasma treatment on a local area of the substrate W. The power supply unit 3500 may be connected to the first upper electrode unit 3310 and the second upper electrode unit 3320.

The power supply unit 3500 may apply power to the first upper electrode unit 3310 and the second upper electrode unit 3320. Although not illustrated in the drawings, high voltage may be applied to electrodes (not illustrated) that are provided in the first upper electrode unit 3310 and the second upper electrode unit 3320, and the lower electrode (the spin head 3110) may be grounded and may generate stable plasma.

Figure 5:
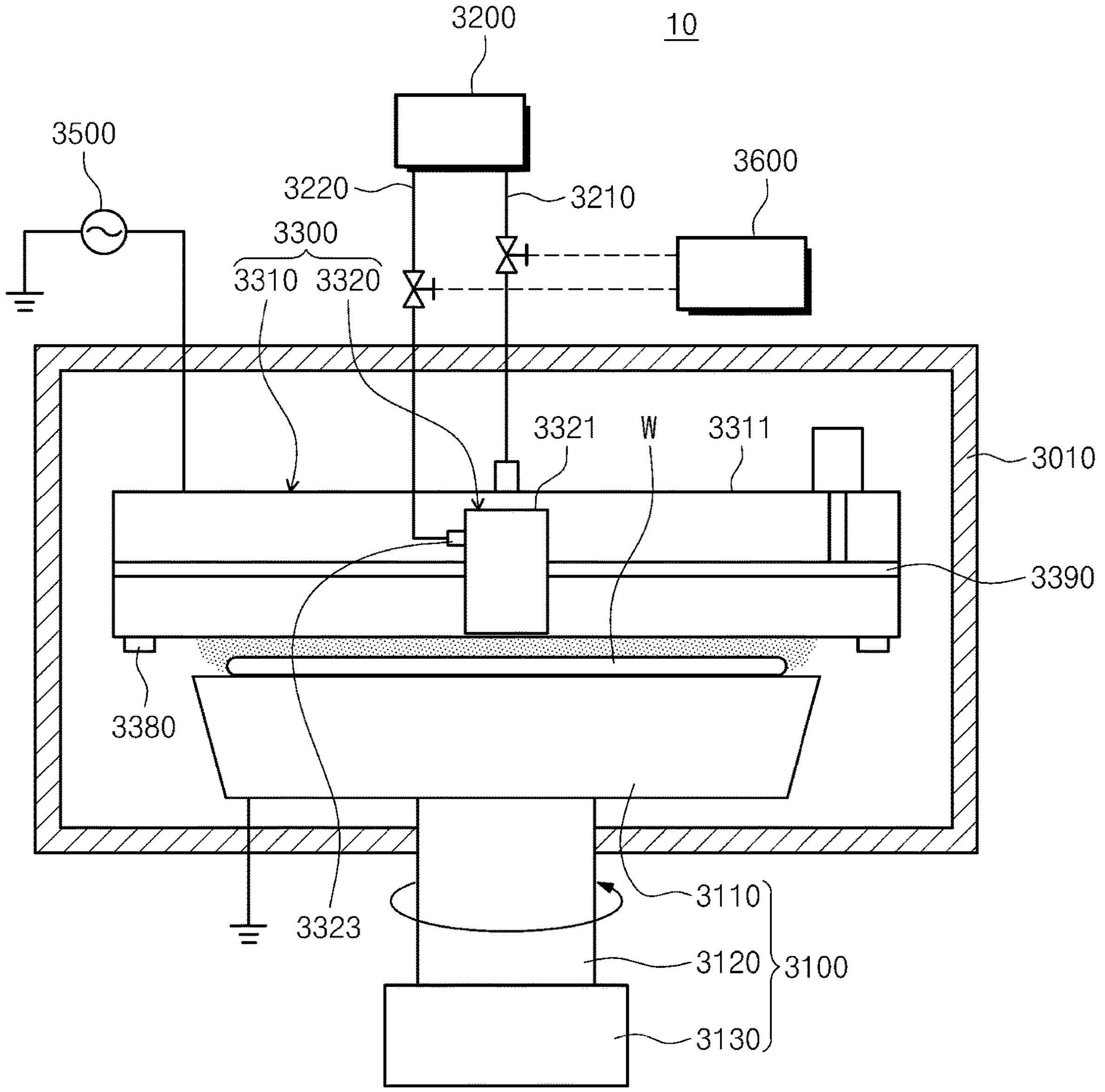
Figure 6:
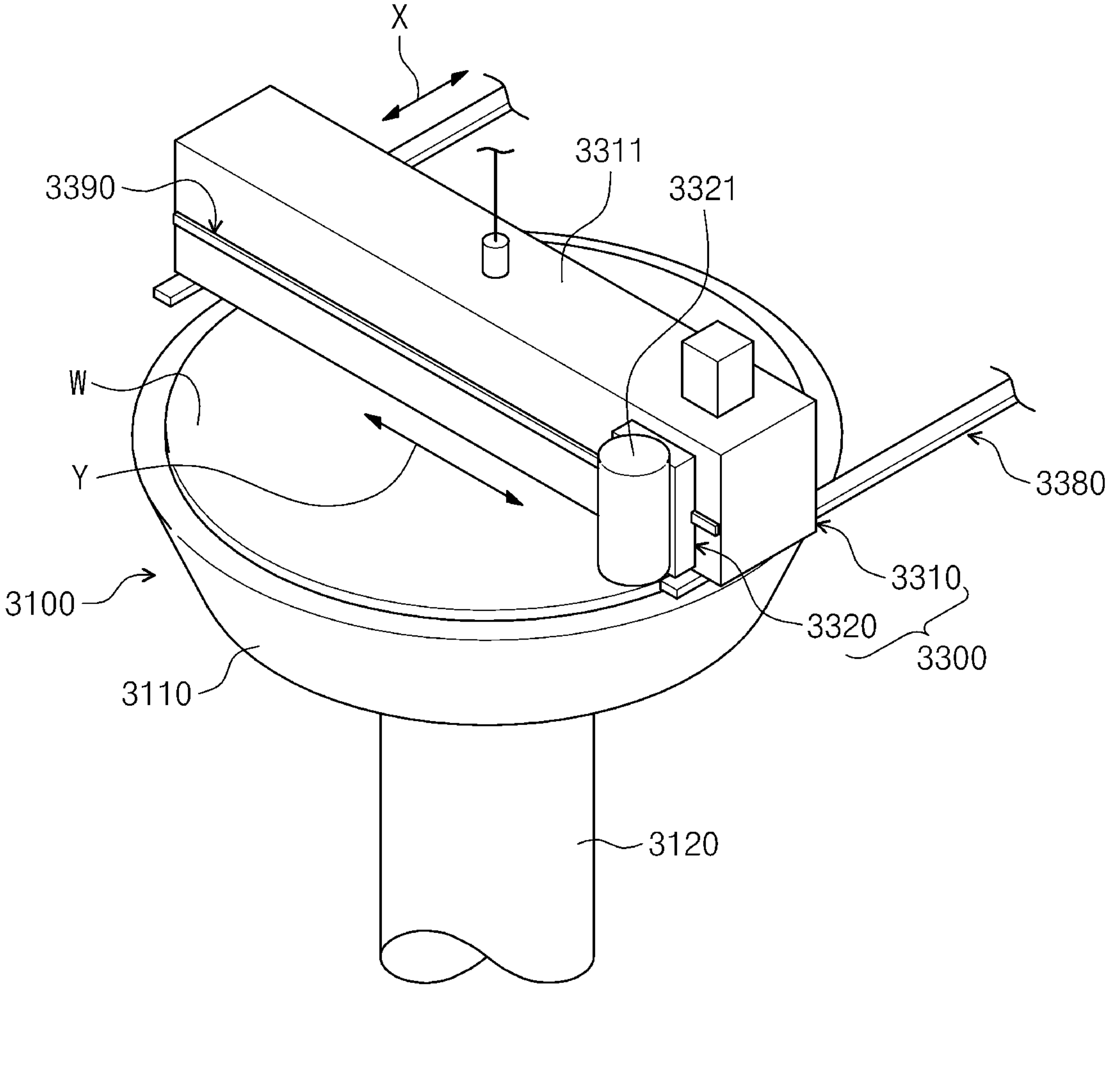

A first reactor body 3311 of the first upper electrode unit 3310 may be movable along a first direction X by a first actuator 3380. The first reactor body 3311 may be disposed over the spin head 3110 so as to be parallel to the substrate W. For example, the first reactor body 3311 may have a bar shape that extends in a rectangular parallelepiped shape. The first reactor body 3311 has an empty space formed therein and is open at the bottom. The first reactor body 3311 may be grounded. A supply port 3313 for supplying a reactant gas into a discharge space 3312 (refer to FIG. 7A) may be installed on an upper end portion of the first reactor body 3311. As illustrated in FIG. 5, a gas supply line 3210 connected with the gas supply unit 3200 is connected to the supply port 3313.

Figure 11:
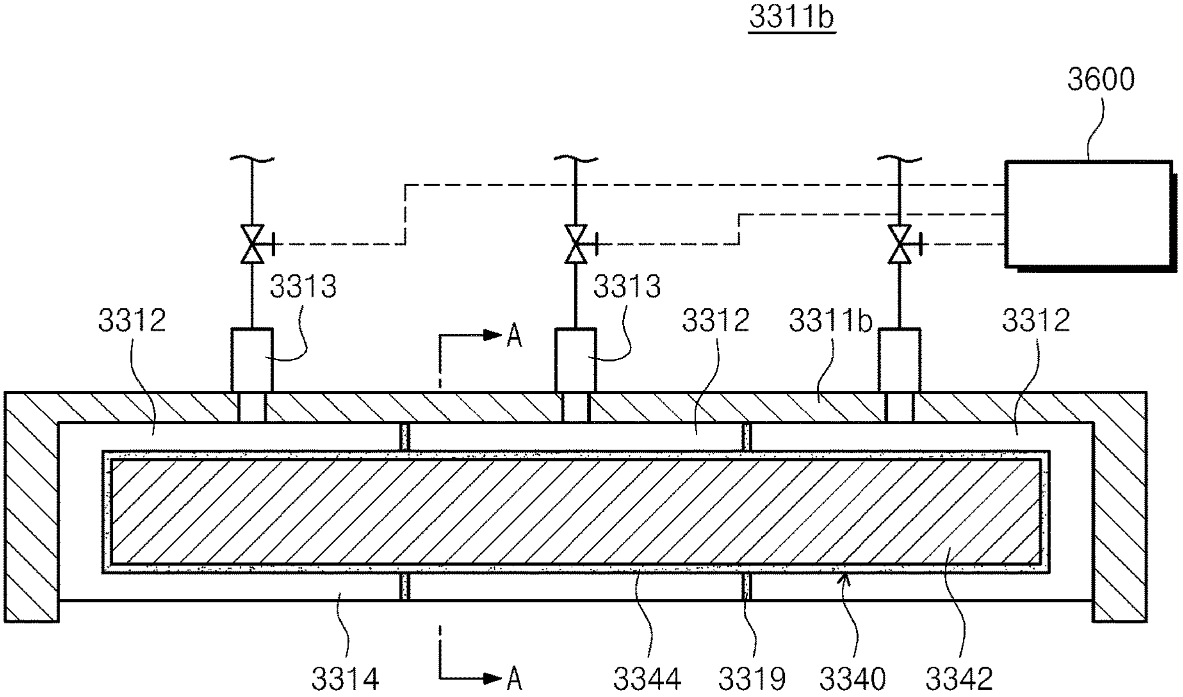
FIGS. 11 to 13 are views illustrating another embodiment of the first reactor body illustrated in FIG. 7A.
Figure 12:
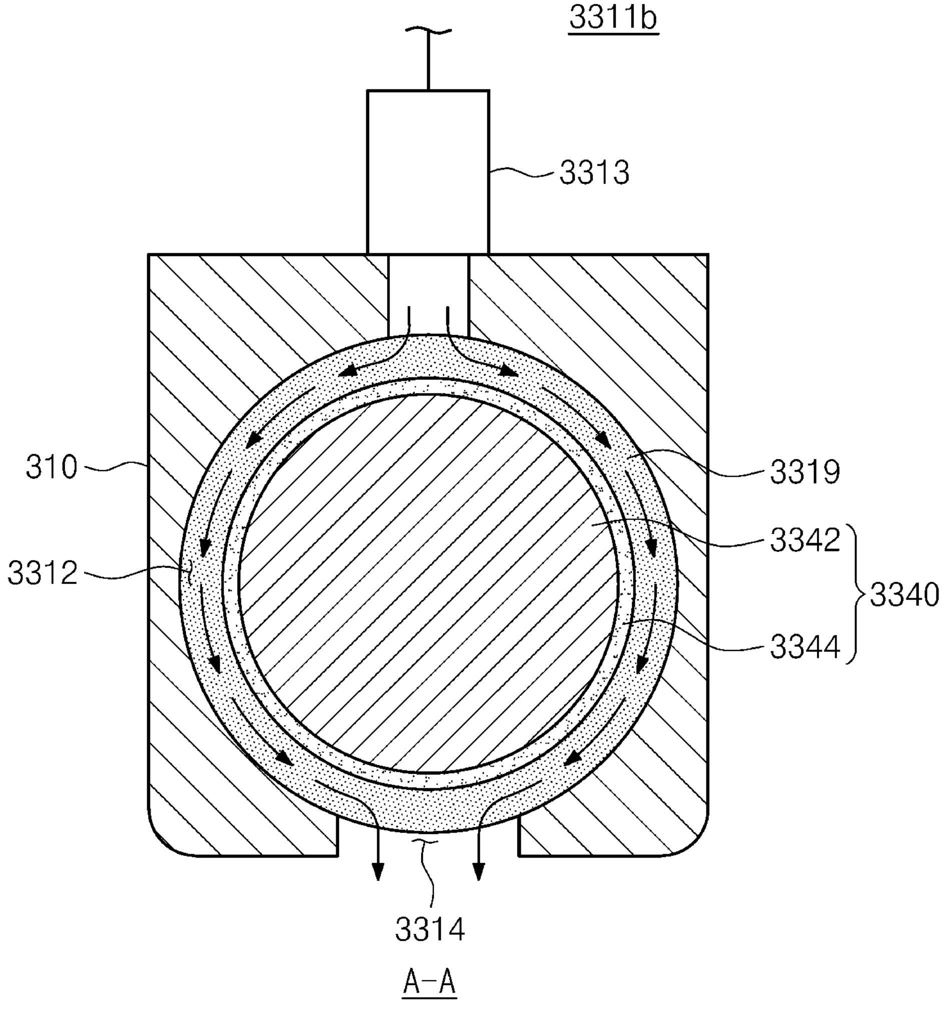
Figure 13:
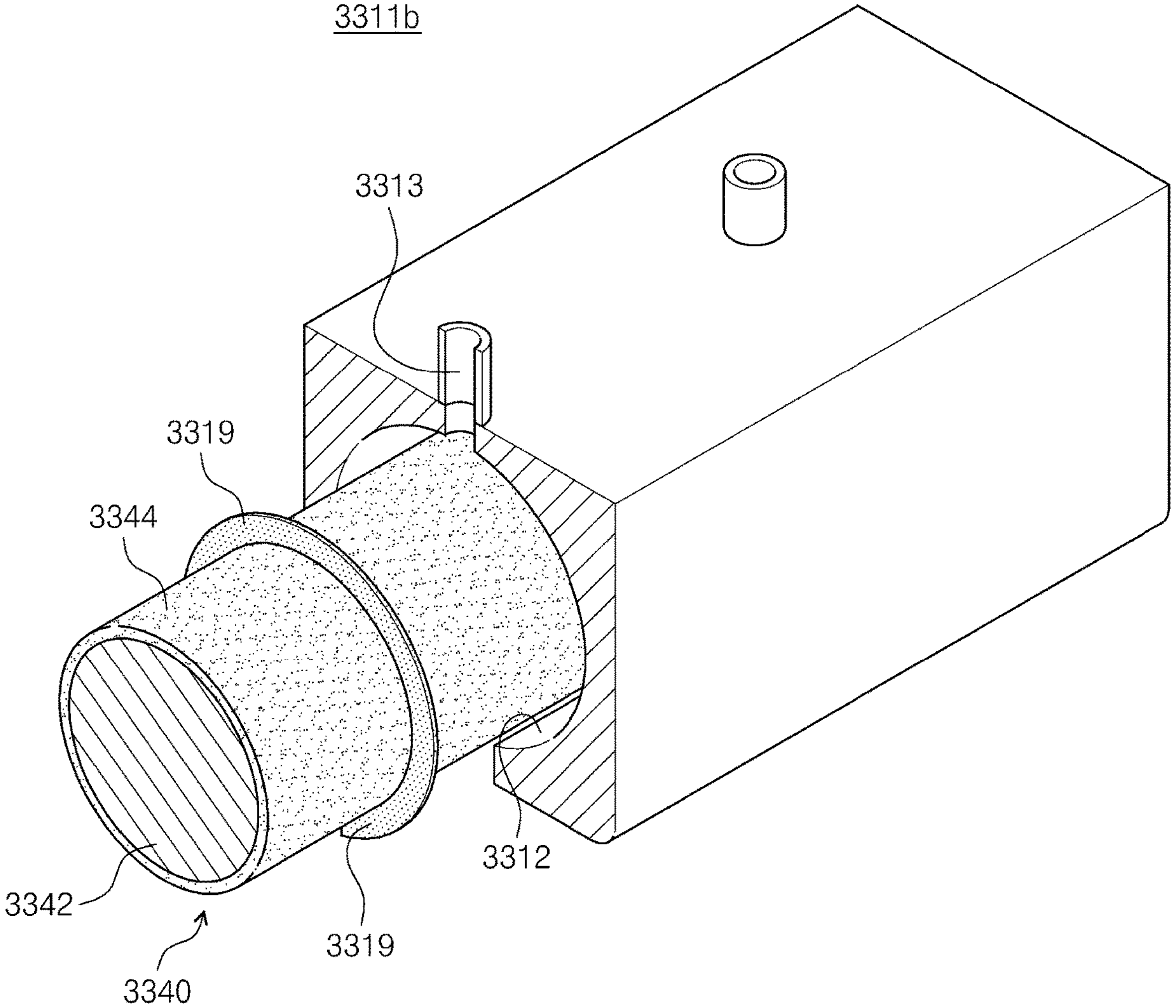

The configuration of the first reactor body 3311 may be similar to the configuration of a first reactor body 3311*b* illustrated in FIGS. 11 to 13. However, partition walls for separating discharge spaces may be omitted.

Figure 7A:
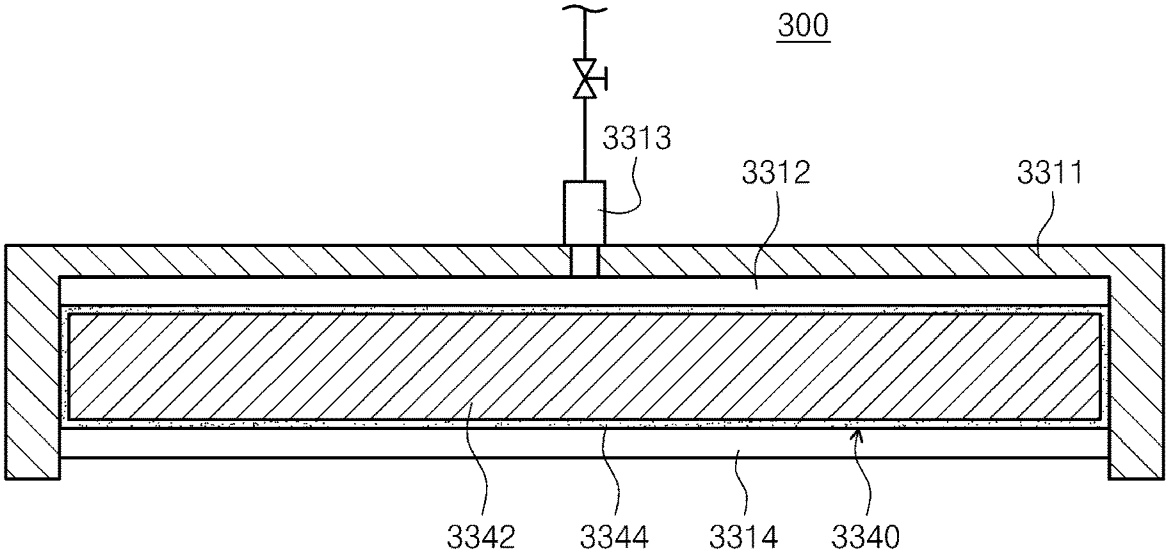
FIG. 7A is a schematic view illustrating a first reactor body.

FIG. 7A is a schematic view illustrating the first reactor body. According to an embodiment, the first reactor body 3311 has a nozzle 3314 in a bottom surface thereof. The nozzle 3314 may be provided in a linear form in the bottom surface of the first reactor body 3311 along a lengthwise direction. The nozzle 3314 is connected with the discharge space 3312. Plasma generated in the discharge space 3312 may be ejected to the substrate W, which is placed on the spin head 3110, through the nozzle 3314. The length of the nozzle 3314 is preferably greater than the diameter of the substrate W. Meanwhile, the first reactor body 3311 has an upper electrode 3340. The upper electrode 3340 is provided in the discharge space 3312. The upper electrode 3340 may include an electrode 3342 and an insulator 3344 surrounding the electrode 3342. The electrode 3342 may have a circular cross-section, and the insulator 3344 surrounding the electrode 3342 may have an annular cross-section. However, without being limited thereto, the electrode 3342 and the insulator 3344 may have various cross-sectional shapes. Although not illustrated, the electrode 3342 may have a fluid channel through which a cooling medium for suppressing heat generation depending on plasma generation passes.

For example, to minimize heat generation depending on discharge, the electrode 3342 may be formed of copper (Cu) or copper alloy that has low electric resistance and high thermal conductivity. In addition, the insulator 3344 may be formed of quartz, alumina, or alumina compound that suppresses heat generation depending on discharge and has resistance to plasma. The insulator 3344 may preferably be formed of aluminum nitride (AlN) having excellent thermal conductivity.

The first reactor body 3311 is preferably disposed such that the center thereof in the lengthwise direction is aligned with the center of a target surface of the substrate W (the center of rotation of the substrate W) depending on a process condition.

The second upper electrode unit 3320 may include a second reactor body 3321 that locally performs plasma treatment on the surface of the substrate W while moving over the substrate W. The second reactor body 3321 may be provided on a side surface of the first reactor body 3311 so as to be movable along a second direction Y perpendicular to the first direction X. For example, the second reactor body 3321 may perform plasma treatment on the surface of the substrate W while being moved in the second direction Y by a second actuator 3390 installed on the first reactor body 3311.

Figure 7B:
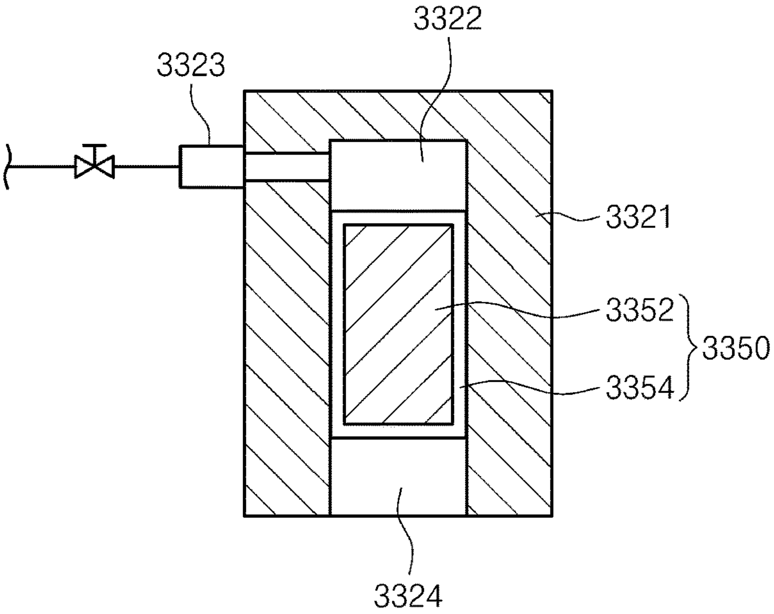
FIG. 7B is a schematic view illustrating a second reactor body.

Referring to FIG. 7B, a supply port 3323 for supplying a reactant gas into a discharge space 3322 may be installed on the second reactor body 3321. As illustrated in FIG. 5, a gas supply line 3220 connected with the gas supply unit 3200 is connected to the supply port 3323.

FIG. 7B is a schematic view illustrating the second reactor body. According to an embodiment, the second reactor body 3321 has a circular nozzle 3324 in a bottom surface thereof. The nozzle 3324 is connected with the discharge space 3322. Plasma generated in the discharge space 3322 may be ejected to a local area of the substrate W, which is placed on the spin head 3110, through the nozzle 3324. Meanwhile, the second reactor body 3321 has an upper electrode 3350. The upper electrode 3350 is provided in the discharge space 3322. The upper electrode 3350 may include an electrode 3352 and an insulator 3354 surrounding the electrode 3352.

Figure 8A:
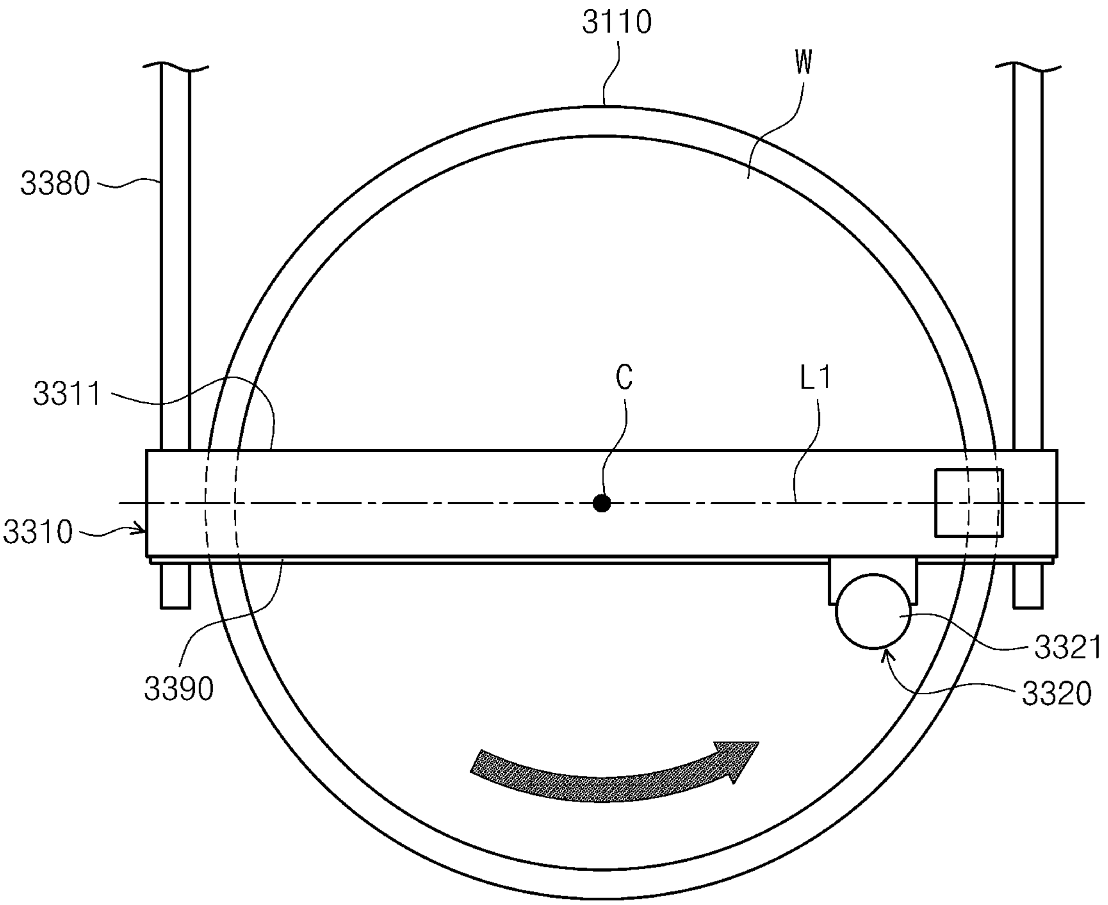
FIGS. 8A and 8B are views illustrating a method of performing plasma treatment on a substrate in the substrate treating unit.
Figure 8B:
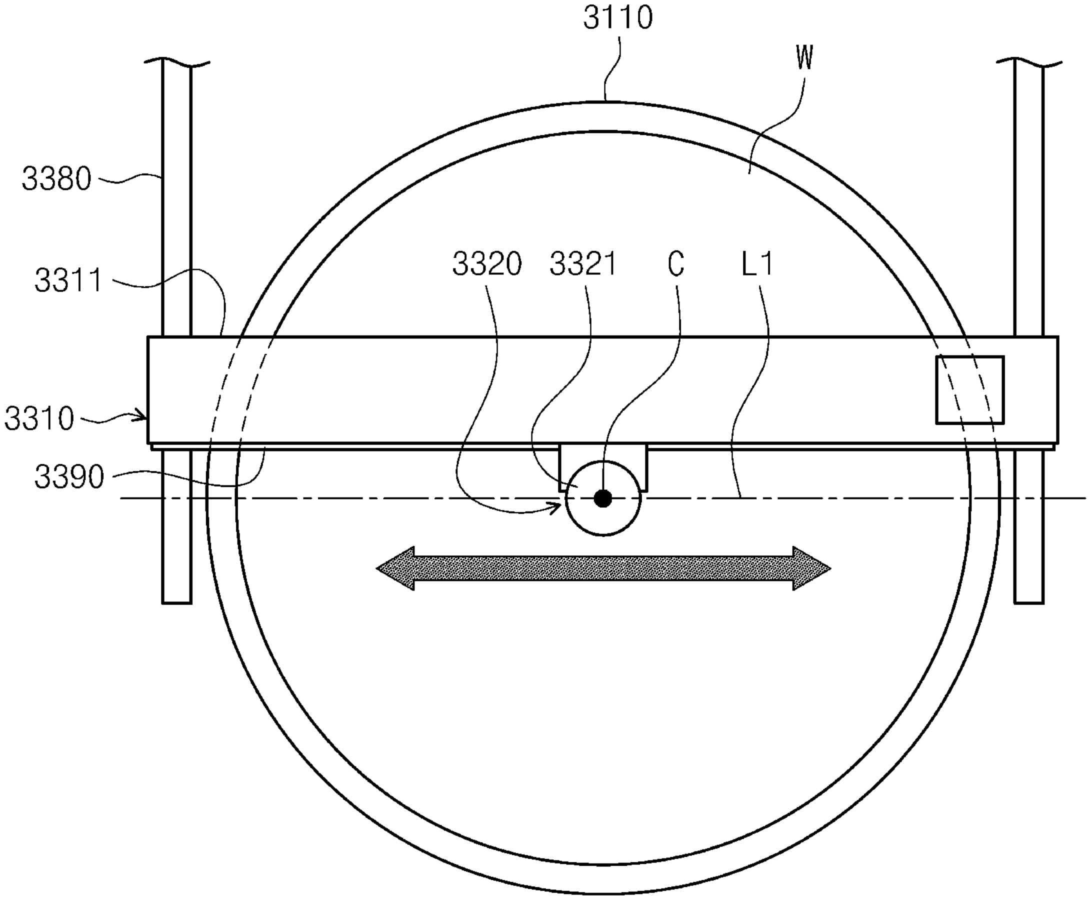

FIGS. 8A and 8B are views illustrating a method of performing plasma treatment on a substrate in the substrate treating unit.

The first upper electrode unit 3310 and the second upper electrode unit 3320 are located over the substrate W in a state in which the substrate W is placed on the spin head 3110. At this time, the first upper electrode unit 3310 is preferably disposed such that the center of the first reactor body 3311 in the lengthwise direction is aligned with the center of a target surface of the substrate W (the center C of rotation of the substrate W). In this state, the first upper electrode unit 3310 performs plasma treatment on the entire surface of the substrate W.

After the plasma treatment on the entire surface of the substrate W (the entire surface treatment step) is completed, plasma treatment is selectively performed, through the second upper electrode unit 3320, on an area where plasma treatment is insufficient. At this time, the first upper electrode unit 3310 may be moved by a predetermined distance such that a travel path of the second reactor body 3321 of the second upper electrode unit 3320 is located on a line L1 passing through the center of rotation of the substrate W.

In this embodiment, it has been described that the first upper electrode unit 3310 and the second upper electrode unit 3320 sequentially perform plasma treatment on the substrate surface. However, the inventive concept is not limited thereto.

Figure 9:
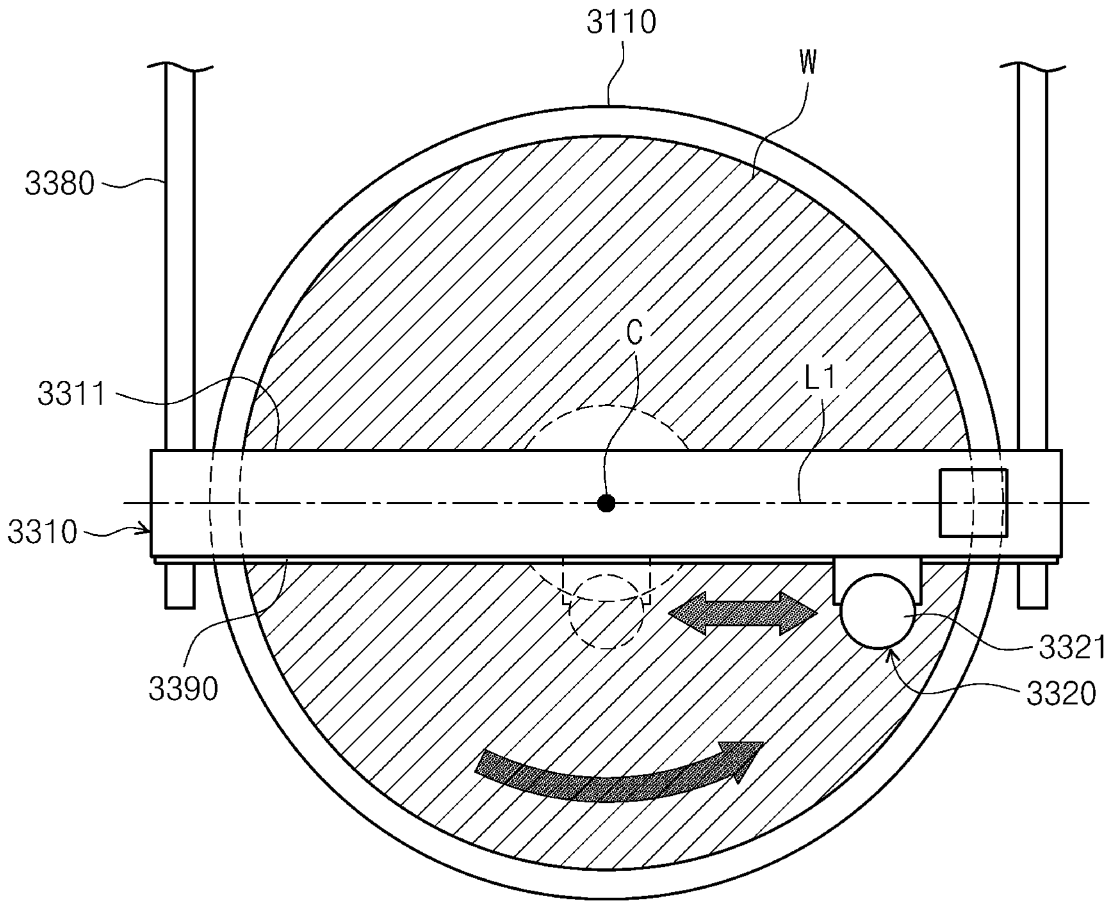
FIG. 9 is a view illustrating another method of performing plasma treatment on a substrate in the substrate treating unit.

FIG. 9 is a view illustrating another method of performing plasma treatment on a substrate in the substrate treating unit.

Referring to FIG. 9, the first upper electrode unit 3310 and the second upper electrode unit 3320 are located over the substrate W in a state in which the substrate W is placed on the spin head 3110. At this time, the first upper electrode unit 3310 is preferably disposed such that the center of the first reactor body 3311 in the lengthwise direction is aligned with the center of a target surface of the substrate W (the center C of rotation of the substrate W). In this state, the first upper electrode unit 3310 performs plasma treatment on the entire surface of the substrate W. At the same time, plasma treatment is selectively performed on a specific area of the substrate W by using the second upper electrode unit 3320. Because a travel path of the second reactor body 3321 of the second upper electrode unit 3320 is out of a line L1 passing through the center of rotation of the substrate W, an area on which the second upper electrode unit 3320 is able to perform plasma treatment may be limited to the area shown by slant lines in FIG. 9. However, plasma density is gradually increased with an approach to the center of the substrate W, on which the first upper electrode unit 3310 performs plasma treatment, and is gradually decreased away from the center of the substrate W. Accordingly, an area on which the second upper electrode unit 3320 has to additionally perform plasma treatment may be sufficiently included in the area shown by the slant lines in FIG. 9.

Figure 10:
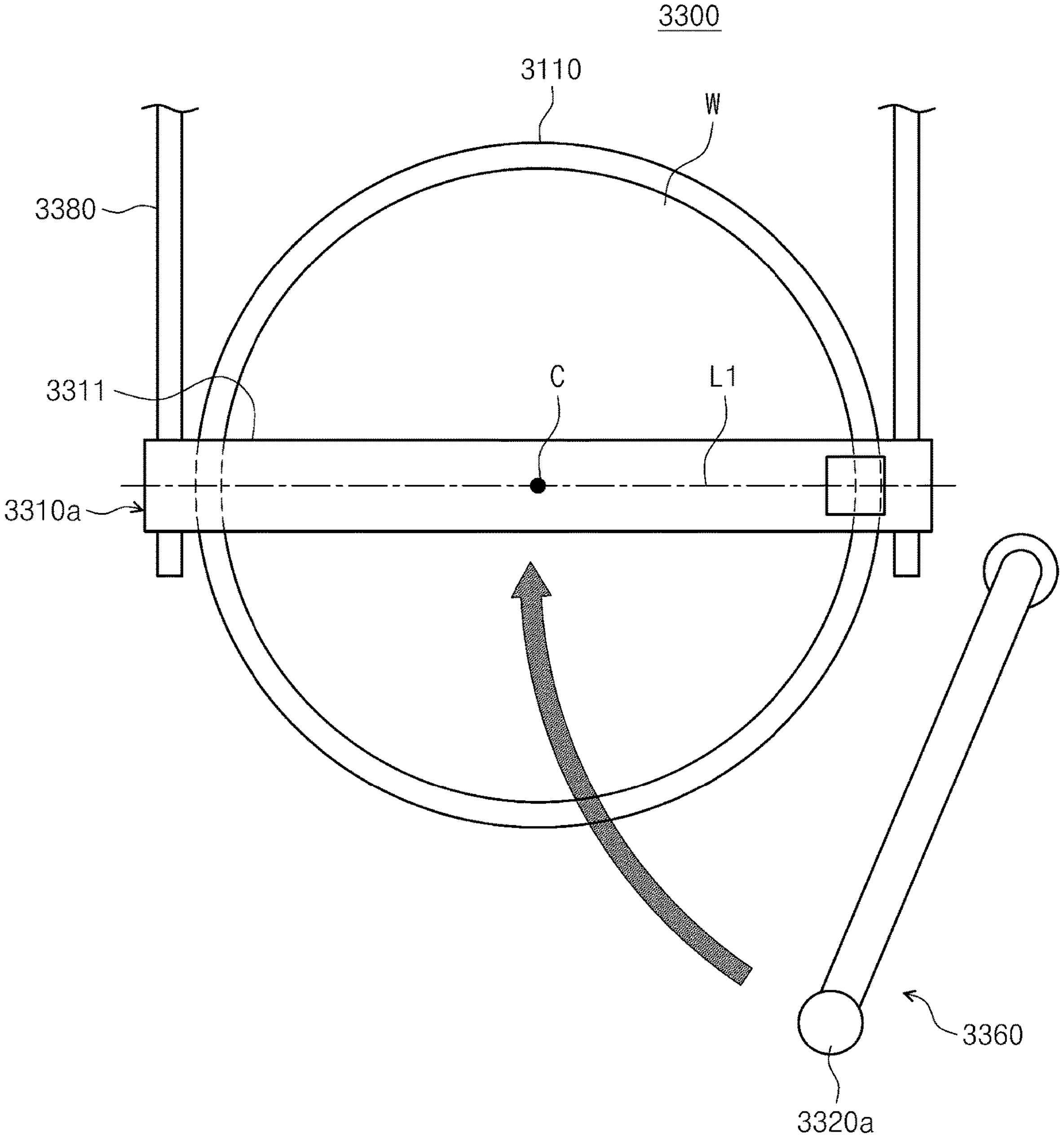
FIG. 10 is a view illustrating a modified example of a plasma generation apparatus.

FIG. 10 is a view illustrating a modified example of the plasma generation apparatus.

The plasma generation apparatus 3300 illustrated in FIG. 10 includes a first upper electrode unit 3310*a* and a second upper electrode unit 3320*a*. The first upper electrode unit 3310*a* and the second upper electrode unit 3320*a* have configurations and functions substantially similar to those of the first upper electrode unit 3310 and the second upper electrode unit 3320 illustrated in FIG. 6. Therefore, the following description of the modified example will be focused on a difference therebetween.

The second upper electrode unit 3320*a* differs from the second upper electrode unit 3320 in that a second reactor body 3321*a* of the second upper electrode unit 3320*a* is provided on a separate moving arm 3350 and locally performs plasma treatment on a surface of a substrate while moving between the center of the substrate and an edge of the substrate as the moving arm 3350 swings.

FIGS. 11 to 13 are views illustrating another embodiment of the first reactor body illustrated in FIG. 7A.

Likewise to the first reactor body 3311 illustrated in FIG. 7A, the first reactor body 3311*b* illustrated in FIGS. 11 to 13 includes a discharge space 3312, a nozzle 3314, and an upper electrode 3340. However, the first reactor body 3311*b* is characterized in that the discharge space 3312 is divided into a plurality of discharge spaces 3312 by a plurality of partition walls 3319.

The first reactor body 3311*b* includes, on an upper end portion thereof, supply ports 3313 for supplying a reactant gas into the respective discharge spaces 3312. As illustrated in FIG. 11, gas supply lines are connected to the supply ports 3313, respectively.

A control unit 3600 controls the supply of the reactant gas into the independent discharge spaces 3312. The control unit 3600 may control a flow rate of the reactant gas and a mixing ratio of the reactant gas by controlling valves on the gas supply lines connected to the supply ports 3313. Although not illustrated, at least two supply lines (gas MFCs) may be connected to each of the supply ports 3313.

For example, the control unit 3600 may perform control such that the flow rate of the reactant gas supplied into a discharge space corresponding to a central area of a substrate is lower than the flow rate of the reactant gas supplied into a discharge space corresponding to an edge area of the substrate, thereby improving plasma treatment uniformity of the entire substrate.

According to the embodiments of the inventive concept, plasma treatment may be uniformly performed on the entire area of a circular object to be treated, a substrate treating apparatus for atmospheric plasma treatment may be made compact, and process time of plasma treatment may be reduced.

Further, according to the embodiments of the inventive concept, the substrate treating unit may be attached to and detached from the index module like the load ports. Accordingly, the substrate treating unit may be easily applied to existing substrate treating equipment.

Furthermore, according to the embodiments of the inventive concept, a substrate may be treated even before the substrate is transferred to the process module. Accordingly, efficiency of a substrate treating process may be improved.

Moreover, according to the embodiments of the inventive concept, the substrate treating unit capable of hydrophilizing or hydrophobicizing a substrate surface may be provided outside the equipment. Accordingly, a substrate may be independently treated outside the equipment.

In addition, according to the embodiments of the inventive concept, a flow rate and a mixing ratio of a gas introduced into the linear type plasma generation apparatus may be differently applied for each of the discharge spaces. Accordingly, treatment uniformity when plasma treatment is performed while a substrate rotates may be improved.

Effects of the inventive concept are not limited to the above-described effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating unit comprising:

a spin chuck having a substrate placed thereon;

a lower electrode provided on the spin chuck; and a plasma generation apparatus located over the spin chuck and configured to generate plasma, wherein the plasma generation apparatus includes:

a first upper electrode unit configured to perform plasma treatment on an entire surface of the substrate;

a first actuator configured to move horizontally the first upper electrode unit over the spin chuck along a first direction;

a second upper electrode unit configured to perform plasma treatment on a local area of the substrate; and a second actuator configured to move the second upper electrode unit along a second direction perpendicular to the first direction, wherein the second upper electrode unit is installed on a drive rail provided to the first upper electrode unit.

2. The substrate treating unit of claim 1, wherein the first upper electrode unit includes a first reactor body provided in a linear type along a lengthwise direction across the substrate and configured to perform plasma treatment on a surface of the substrate configured to rotate together with the spin chuck.

3. The substrate treating unit of claim 1, wherein the first upper electrode unit includes:

a first reactor body having a hollow bar shape provided in a linear type along a lengthwise direction across the substrate, the first reactor body having a discharge space inside; and a nozzle provided in a linear type on a bottom surface of the first reactor body along the lengthwise direction and configured to eject plasma generated in the discharge space to the substrate placed on the spin chuck.

4. The substrate treating unit of claim 3 wherein the nozzle has a length greater than or equal to a diameter of the substrate.

5. The substrate treating unit of claim 3, wherein the second upper electrode unit includes the second reactor body configured to locally perform plasma treatment on a surface of the substrate while moving over the substrate.

6. The substrate treating unit of claim 4, wherein the drive rail installed on a side surface of the first reactor body.

7. The substrate treating unit of claim 2, wherein the first reactor body includes independent discharge spaces separated by a plurality of partition walls, and wherein a reactant gas is independently supplied into the independent discharge spaces.

* * * * *